United States Patent [19]
Jeng et al.

[11] Patent Number: 5,936,903
[45] Date of Patent: Aug. 10, 1999

[54] SYNCHRONOUS SEMICONDUCTOR MEMORY DEVICE

[75] Inventors: Terry Jeng, Saratoga, Calif.; Chuan-Yu Wu, Keelung, Taiwan; Jason Hou, Fremont, Calif.

[73] Assignee: Powerchip Semiconductor Corp., Hsin-chu, Taiwan

[21] Appl. No.: 09/130,652

[22] Filed: Aug. 7, 1998

Related U.S. Application Data

[62] Division of application No. 08/806,828, Feb. 26, 1997, Pat. No. 5,825,710.

[51] Int. Cl.$^6$ .................................................. G11C 7/00
[52] U.S. Cl. .................... 365/203; 365/204; 365/230.03; 365/230.08; 365/233
[58] Field of Search ............................. 365/230.04, 203, 365/204, 230.03, 230.08, 233

[56] References Cited

U.S. PATENT DOCUMENTS

| | | | |
|---|---|---|---|
| 4,602,354 | 7/1986 | Craycraft et al. | 365/203 |
| 4,636,664 | 1/1987 | Craycraft et al. | 307/530 |
| 5,511,029 | 4/1996 | Sawada | 365/201 |
| 5,517,462 | 5/1996 | Iwamoto et al. | 365/233 |
| 5,691,949 | 11/1997 | Hively et al. | 365/230.03 |
| 5,825,710 | 10/1998 | Teng et al. | 365/230.03 |

*Primary Examiner*—Viet Q. Nguyen
*Attorney, Agent, or Firm*—Ladas & Parry

[57] ABSTRACT

A synchronous dynamic RAM capable of segmentally precharging each memory bank. In this SDRAM, each memory bank is divided into multiple memory blocks. Each of these memory blocks internally has its own row access circuitry, but performs independent precharging operation. Access to the memory bank can be cooperative externally, and precharge operation can be separately applied to these memory blocks while allowing utilization of row cache that is available on other blocks. The SDRAM further includes a control device for generating a dedicated precharge signal to each memory block according to a precharge signal for each memory bank. Each dedicated precharge signal independently precharges the corresponding memory block regardless of the access operations executed by other memory blocks. The dedicated precharge signal and a succeeding activate signal for activating a different memory block are overlapped in timing so that the precharge sequence is implanted in the succeeding activate signal and the data access time is shortened.

4 Claims, 10 Drawing Sheets

SYNCHRONOUS SEMICONDUCTOR MEMORY DEVICE

This is a divisional of Application Ser. No. 08/806,828 filed on Feb. 26, 1997, now U.S. Pat. No. 5,825,710.

BACKGROUND OF THE INVENTION

1. Field of the Invention

The present invention relates in general to a precharge approach for semiconductor memories, such as Synchronous Dynamic Random Access Memories (SDRAMs), and more specifically, to a SDRAM that can segmentally precharge each bank in the SDRAM and then shorten memory access latency.

2. Description of the Prior Art

Semiconductor memory devices are widely used as a main storage media in many electronic systems, especially in computer systems. Static Random Access Memories (SRAMs) and Dynamic Random Access Memories (DRAMs) are two examples of these semiconductor memory devices, in which the DRAMs have a lower price and primarily serve as the main memory devices in computer systems, while SRAMs have a faster access speed than the DRAMs and usually serve as cache memory for bridging the operation speed between a microprocessor and the DRAM main memory.

With the increasing operation speed of microprocessors, the speed mismatch between the processors and the DRAMs is significant and has a severe impact on the system performance. Conventional DRAMs employ an operation mode called Fast Page Mode (FPM), in which memory in a page given by a specific row address can be randomly accessed. For increasing the operation speed, a new operation mode called Extended Data Output (EDO) has been applied in DRAM products. In EDO DRAMs, performance improvement is achieved by extending the data valid time until the next data drives the memory bus. EDO DRAMs have a 30~40% speed improvement. However, this still can not keep up with the requirement of the increasing processor speed.

Synchronous DRAMs employ a bursting technique to overcome such a speed limitation. When a first page address has been accessed, the SDRAM can predict the address of the memory location to be accessed. Such an address prediction scheme eliminates the delay associated with detecting and latching an externally provided address into the SDRAM. Using SDRAMs, users must previously set several parameters of SDRAMs before any read and write commands. First, parameters of burst length (sometimes abbreviated as BL) and burst type must be defined to the SDRAM. The burst length is used to define the number of bits associated with this access operation. Thus, an internal address counter can properly and timely generate the next memory location to be accessed according to the starting access address and the burst length during the following access operations. The burst type is used to decide whether the address counter is to provide sequential ascending page addresses or interleaved page addresses within the defined burst length. In addition, a parameter of CAS latency is also previously set before read commands, to decide the delay from when a read command is registered on a rising clock edge to when the data from that read command becomes available at the outputs.

Figure 1:
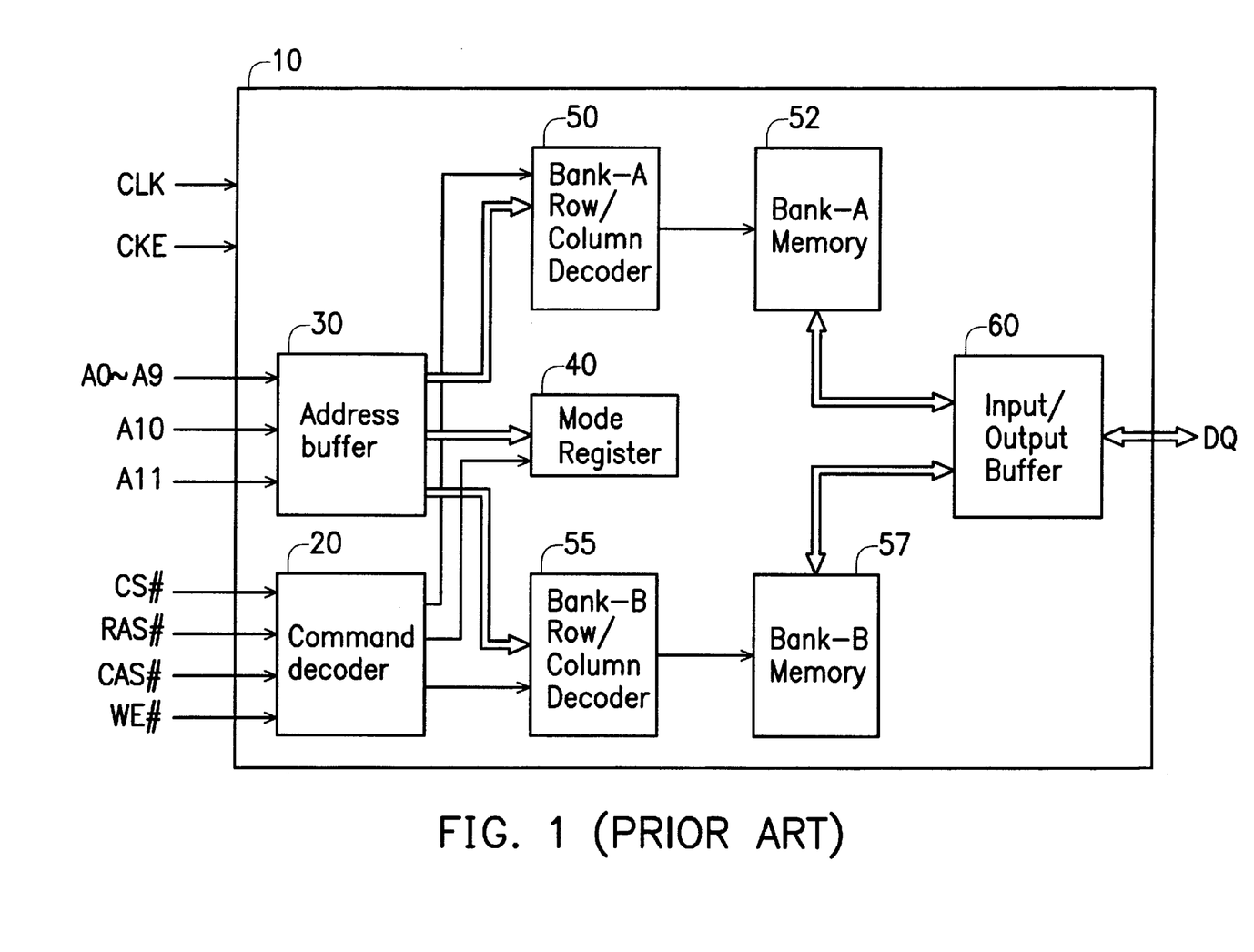
FIG. 1 (PRIOR ART) schematically illustrates a blocking diagram of the SDRAM architecture.

FIG. 1 (PRIOR ART) schematically illustrates a blocking diagram of a common SDRAM architecture. Usually, SDRAMs employ a two-bank architecture, as shown in FIG. 1, for hiding row precharge and first access delays by alternately opening (interleaving) the two memory banks. CLK represents the system clock input and all SDRAM inputs are sampled at the rising edges of this clock. The CKE signal is used to activate or deactivate the CLK signal when high or low, respectively. A0~A9, A10 and A11 (or called BANK SELECT, BS) represent the address signals, in which the BS signal is used to select the accessed memory bank. In addition, CS# represents the chip select signal (active low), RAS# represents the row address strobe signal (active low), CAS# represents the column address strobe signal (active low) and WE# represents the write enable signal (active low). These four signals are used to set the operation mode of SDRAM 10.

The CLK signal is fed to all components in DRAM 10 for synchronizing the operation. The combination of these control signals fed to command decoder 20 is used as the operation command of SDRAM 10. For example, a mode register set command is issued when signals CS#, RAS#, CAS# and WE# are low. When the mode register set command is issued, current data on the address terminals A0~A11 are transferred to and stored in the mode register 40 via address buffer 30. The mode register 40 is used to store access parameters, such as the burst length, the burst type and the CAS latency. A bank activation command must be issued before any read and write command. The bank activation command is triggered when signals CS# and RAS# are low, and signals CAS# and WE# are high. At this time, A11 (BS) is used to select the accessed memory bank and current data on A0~A10, referred as a column address, which is transmitted to selected bank-A row/column decoder 50 or bank-B row/column decoder 55. After the bank activation command, a read command or a write command can follow. The read command is set when CS# and CAS# are low, and RAS# and WE# are high. In addition, the write command is set when CS#, CAS# and WE# are low, and RAS# is high. Within a read or write command, a column address is input by A0~A10. The access memory location in bank-A memory 52 or bank-B memory 57 is determined by the row address provided by the bank activate command and the column address provided by the read or write command. This memory location is then accessible by means of data input/output DQ via input/output buffer 60.

When a new row access command or a new bank access command is issued, SDRAM requires a pre-charge operation to pre-charge bit-line pairs before sensing and amplifying data from the selected memory locations. Pre-charge is usually implemented by a dedicated circuit for each bank. Generally, SDRAMs support two pre-charge schemes, one is to issue an independent pre-charge command to the SDRAMs, and another is to issue a read or write command with pre-charge function. When an access command with pre-charge function is issued, the pre-charge operation will be automatically executed near the end of data bursting sequences. Traditional SDRAM must pre-charge the whole memory bank even though only one page is accessed. Cleanly, the pre-charge requirement may limit the issue of the next command and lower the operation speed. For example, when the write operation with auto-precharging function is executed, the bank undergoing auto-precharge can not be re-activated until a reference delay, called the data-in to active delay $t_{DAL}$, is satisfied. The operation speed is inevitably affected by the undue delay.

SUMMARY OF THE INVENTION

Therefore, an object of the present invention is to provide a SDRAM that can support segmentally precharging memory blocks within a memory bank when row miss occurs.

Another object of the present invention is to provide a SDRAM having a reduced data access latency by hiding precharge commands in the succeeding activate command phase.

The present invention achieves the above-indicated objectives by providing a SDRAM capable of segmentally precharging memory blocks within a memory bank. In this SDRAM, each memory bank is divided into a plurality of memory blocks. Each of these memory blocks internally has its own row access circuitry, but performs independent precharging operation. That is, access to the memory bank can be cooperative externally, and precharge operation can be separately applied to these memory blocks while allowing utilization of row cache that is available on other blocks. The SDRAM circuit includes a control device for generating a dedicated precharge signal to each memory block according to a master precharge signal for each memory bank. Each dedicated precharge signal independently precharges the corresponding memory block regardless of the access operations executed by other memory blocks. In fact, the dedicated precharge signal and a succeeding activate signal for activating a different memory block are partially overlapped in timing so that the precharge sequence is implanted in the succeeding activate signal and the data access time is shortened.

Alternatively, the SDRAM can employ a memory device for storing accessed memory block addresses. According to the previously accessed memory block address, a control device generates a set of control signals to each memory block. These control signals may precharge the previously accessed memory block while another command signal activates the memory block to be accessed in a next sequence simultaneously. This also causes the production of the precharge sequence hidden in the succeeding activate signal.

Various other objects, advantages and features of the present invention will become readily apparent from the ensuing detailed description, and the novel features will be particularly pointed out in the appended claims.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

The present invention discloses a new precharge scheme applied in semiconductor memory devices, such as SDRAMs, for reducing memory access latency and increasing access speed. In SDRAMs, the precharge operation is a necessary step when a new row is accessed or when a bank switch happens. In conventional SDRAMs, the bank that is undergoing the precharge operation cannot be reactivated until a predefined period is reached. In the present invention, a large amount of undue delay can be eliminated by using the new precharge scheme. Generally, there are at least two memory banks in a SDRAM chip, in which these memory banks can be precharged separately or simultaneously. First, each memory bank is divided by a plurality of memory blocks. The memory blocks in the same memory bank may still share the same master access peripheral circuit that can either activate partial memory cell or pre-charging the bank. By incorporating with the received block addresses, these memory blocks themselves may use their own precharge control signals to independently perform the precharge operation. This means that these memory blocks may be separately precharged during operation. In addition, a control circuit is used to generate dedicated precharge control signals for these memory blocks. Therefore, operations of precharging the previously accessed memory block and activating the memory block to be subsequently accessed may be executed simultaneously. The undue delay between different row access operations can be reduced.

Figure 2:
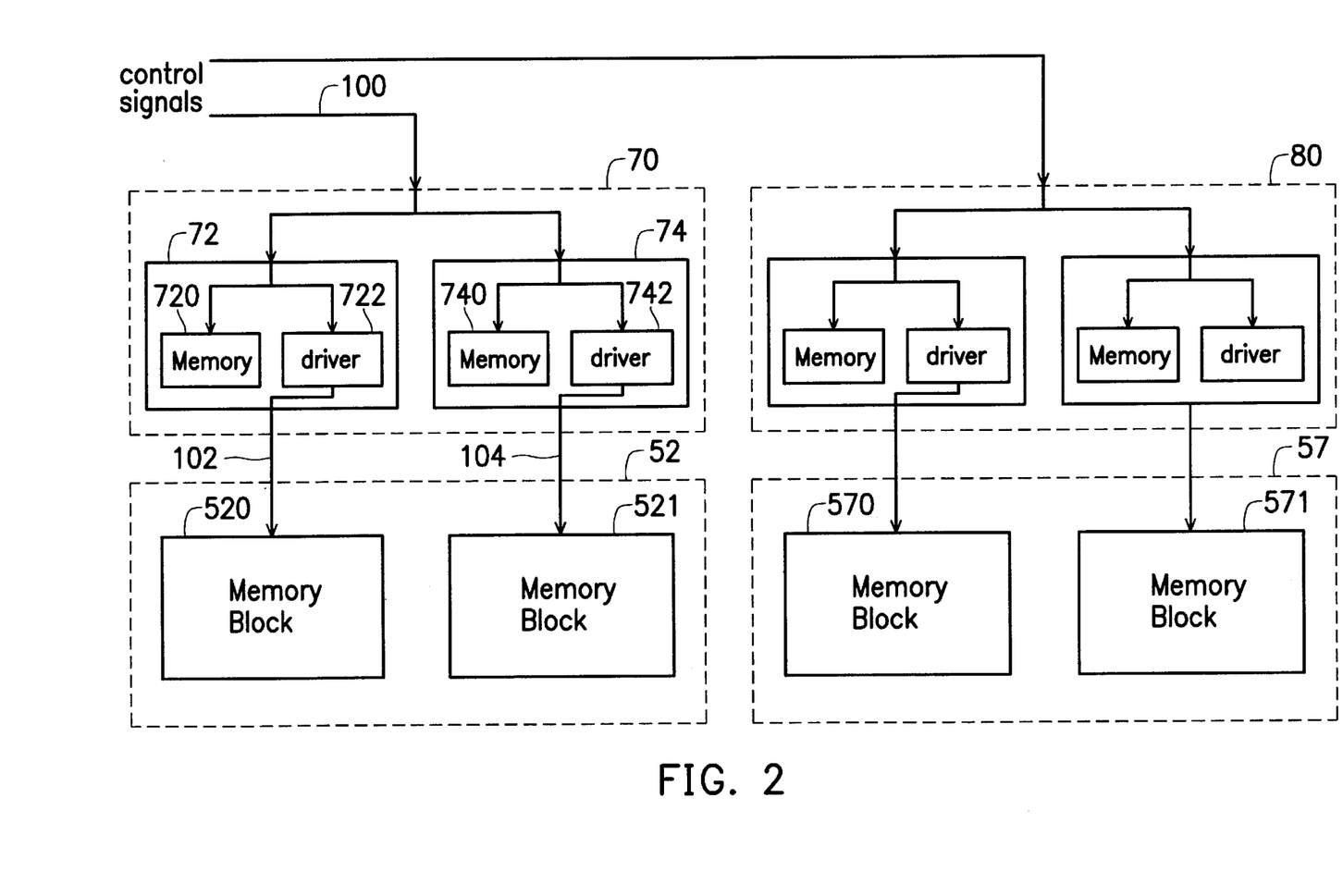
FIG. 2 is a blocking diagram of the segmental precharge circuitry in accordance with the embodiment of the present invention.

FIG. 2 is a blocking diagram of the segmental precharge circuitry in this embodiment. In FIG. 2, the SDRAM has two memory banks, 52 and 57. Each memory bank is divided into two memory blocks, memory blocks 520 and 521 for bank 52, memory blocks 570 and 571 for bank 57. As described above, the control signals are separately fed to banks 52 and 57 for independent control. Control devices 70 and 80 are inserted between the control signals and the corresponding banks 52 and 57, for respectively generating dedicated control signals to blocks 520, 521, 570 and 571. These dedicated control signals may independently precharge the corresponding memory blocks, regardless of access operations executed by other memory blocks. As shown in FIG. 2, control device 70 includes circuits 72 and 74 for generating the dedicated control signals 102 and 104. Memory 720 in circuit 72 and memory 740 in circuit 74 are used to store currently sequential accessed block memory addresses. According to the previously accessed memory block address, driver 722 in circuit 72 and driver 742 in circuit 74 generate the dedicated control signals 102 and 104. However, it is understood by those skilled in the art that the control devices 70 and 80 can be merged into the conventional device that generates the precharge control signal.

Figure 3A:
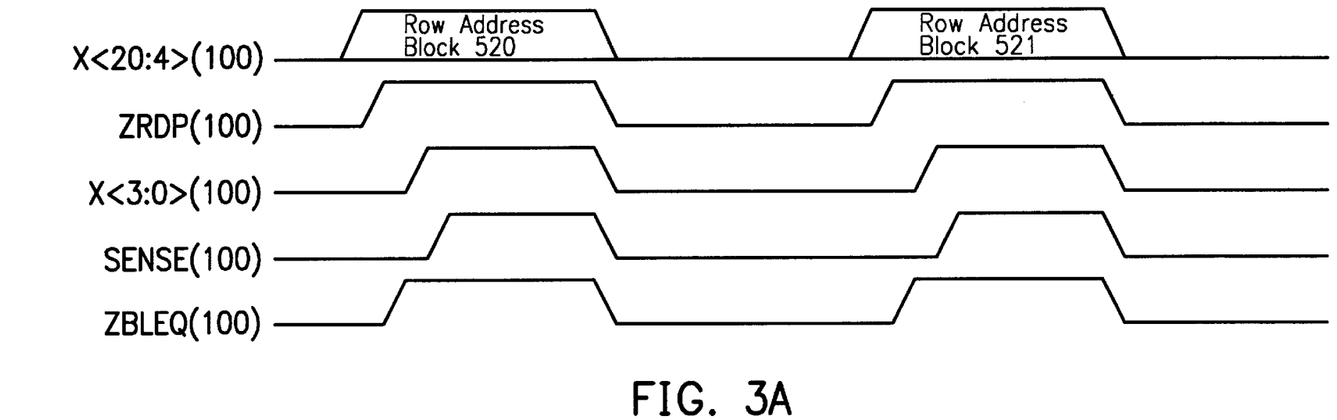
FIGS. 3A, 3B and 3C show timing diagrams of the master precharge control signals and the dedicated precharge control signals for each memory blocks in FIG. 2, respectively.
Figure 3B:
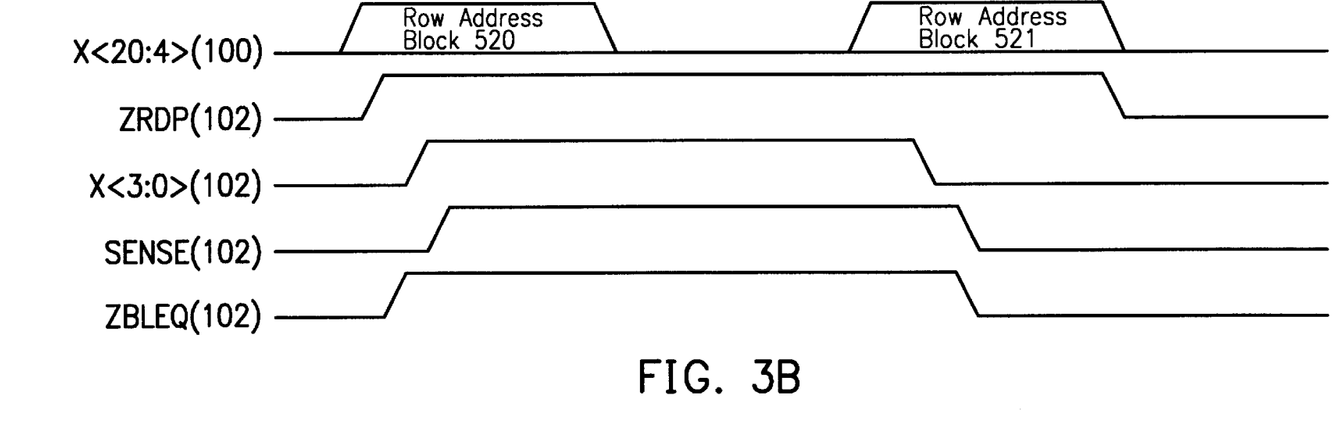
Figure 3C:
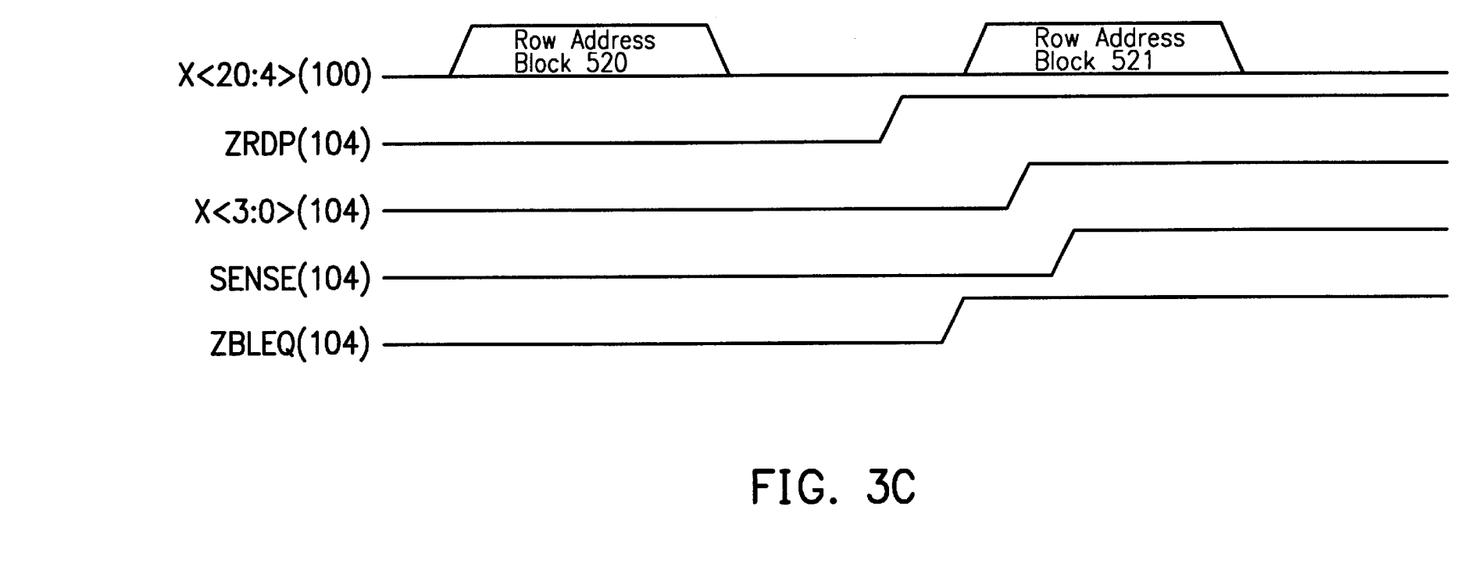

FIGS. 3A, 3B and 3C show timing diagrams of the control signal 100 and the dedicated control signals 102 and 104 for blocks 520 and 521, respectively. In these figures, symbol X represents address data, in which <20:4> denotes a selected pre-decoded row address and <3:0> denotes a secondary decoded row address. In addition, ZRDP represents the precharge signal, SENSE represents the sensing signal, and ZBLEQ represents the bit-line equalization signal. In the control signal 100 shown in FIG. 3A, two precharge commands are issued by ZRDP, one having a selected row address in block 520 and another having a row address in block 521. This precharge signal is fed to circuits 72 and 74 simultaneously. Circuits 72 and 74, according to the accessible addresses in memory block 521 and 521, generate dedicated precharge signals ZRDP(102) and ZRDP(104), as shown in FIGS. 3B and 3C. Note that the precharge signals ZRDP (102) and ZRDP (104) are overlapped in timing. This allows the precharge operation to coincide with the succeeding access or activate command.

In summary, each memory bank is divided into multiple memory blocks. The segmental precharge function is enabled when an activate command for a row address different from the current one is issued. That is, the opened memory block remains opened when there is no other access requirement. When a new command requests a new address in other memory blocks, an activate command for the new memory block and a precharge operation for the original memory block are issued simultaneously. Therefore, this segmental precharge scheme can effectively reduce data access latency, especially when a page miss occurs.

For convenience, the precharging operation of the SDRAM in accordance with the present invention is summarized as follows.

(1) When a bank hit and a page hit occur during accessing the SDRAM, only the accessed column address is changed. That means that there is no need for discharging the accessed memories.

(2) When a bank hit but a page miss occur during accessing the SDRAM, it is inevitable to precharge the accessed memories. However, if the previously accessed memories and the memories that are ready to be accessed are located in different memory blocks, the segmentally precharging operation of the present invention can be performed to reduce the data access latency.

According to the segmentally precharging circuitry shown in FIG. 2, several practical access situations are exemplified for clarity, in reference with FIG. 4 to FIG. 9. In this examples, CAS Latency (CL) is set as 2 and Burst Length (BL) is set as 4.

Figure 4:
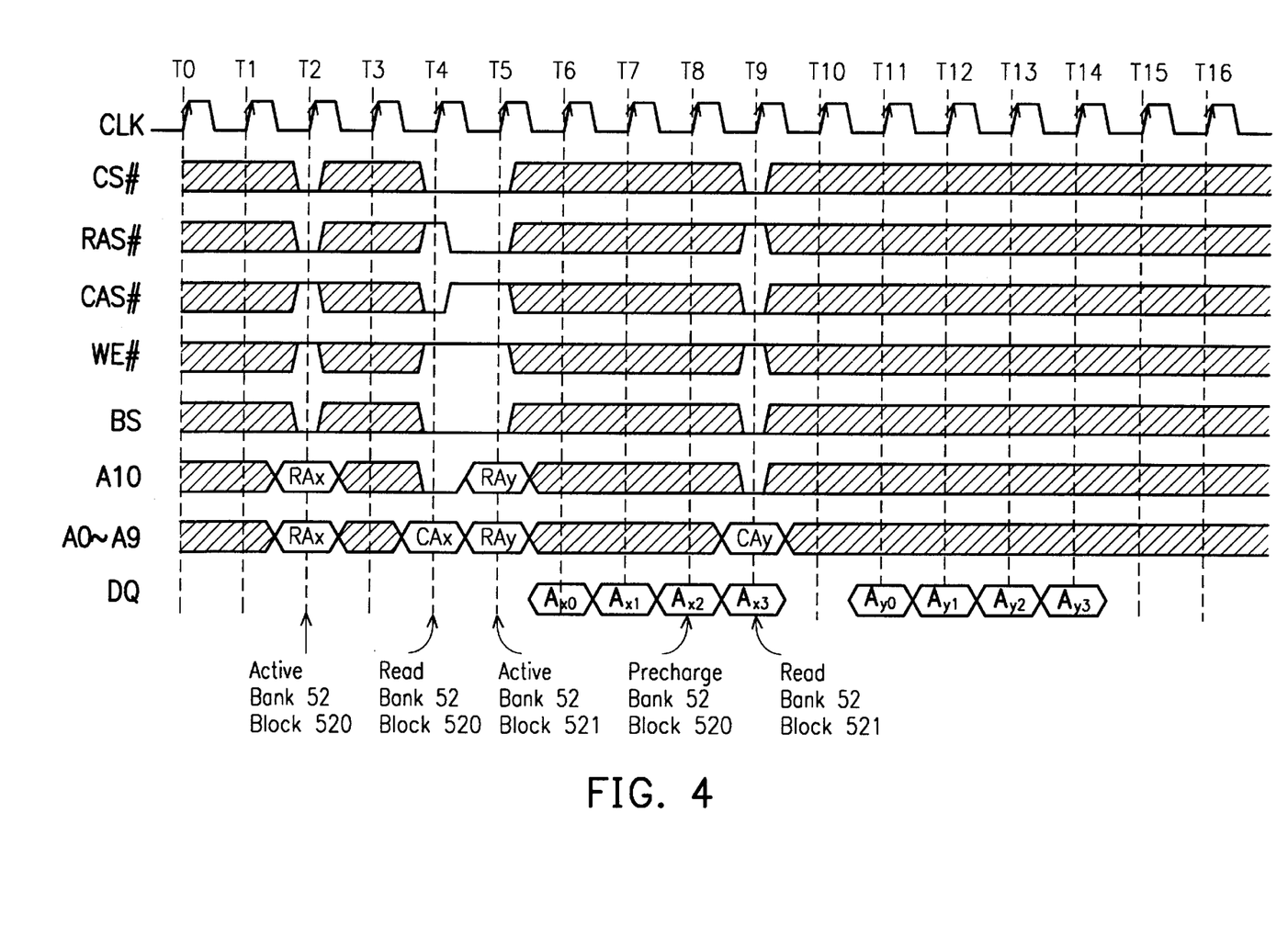
FIG. 4 shows a timing diagram of the clock signal, the command signals, the address signals and the resultant data output signals in a first example of the embodiment, which illustrates the case of reading data from different memory blocks in the same memory bank.

FIG. 4 shows a timing diagram of the clock signal (CLK), the command signals (CS#, RAS#, CAS#, WE#), the address signals (A0–A9, A10, A11) and the resultant data output signals (DQ) in a first example of the embodiment. This case illustrates a situation of reading data from different memory blocks in the same memory bank. All command signals and address signals must be sampled at the rising edges of the clock signal CLK, which have been ordered and denoted as T0~T16 as shown in FIG. 4. The meanings of these command signals and address signals have been described as above. In addition, hatched regions in the timing mean "don't care" or "NOP" (no operation). At rising edge T2 of clock CLK, an activate command (when CS# and RAS# are low, CAS# and WE# are high) is issued to activate block 520 of bank 52 (when BS is low) in FIG. 2. Meanwhile, row address RAx is also presented in A0~A10. Then at the rising edge T4, a read command (when CS# and CAS# are low, RAS# and WE# are high) for block 520 of bank 52 is issued to initiate a read operation. At this time, column address CAx is also presented in A0~A9. Due to CAS latency, the data is available for two more cycles when the read command is issued. Therefore, at the rising edges T6~T9, a burst of data $A_{x0}$, $A_{x1}$, $A_{x2}$, $A_{x3}$ is sent to the terminals DQ. In addition, at rising edge T5, an activate command is issued to activate block 521 of bank 52. Two memory blocks are opened at this time. Note that any access command for block 521 must be issued after the precharge operation of block 520, which is initiated at the rising edge T8. At the rising edge T9, a read command for block 521 of bank 52 is issued and initiates a read operation. Together with this read command, column address CAy is presented at A0~A9. Similar to the previous read command, a burst of data $A_{y0}$, $A_{y1}$, $A_{y2}$ and $A_{y3}$ is sent to the terminals DQ at the rising edges T11~T14. The memory access latency, therefore, can be shortened since the two memory blocks in the same memory bank can be simultaneously opened.

Figure 5:
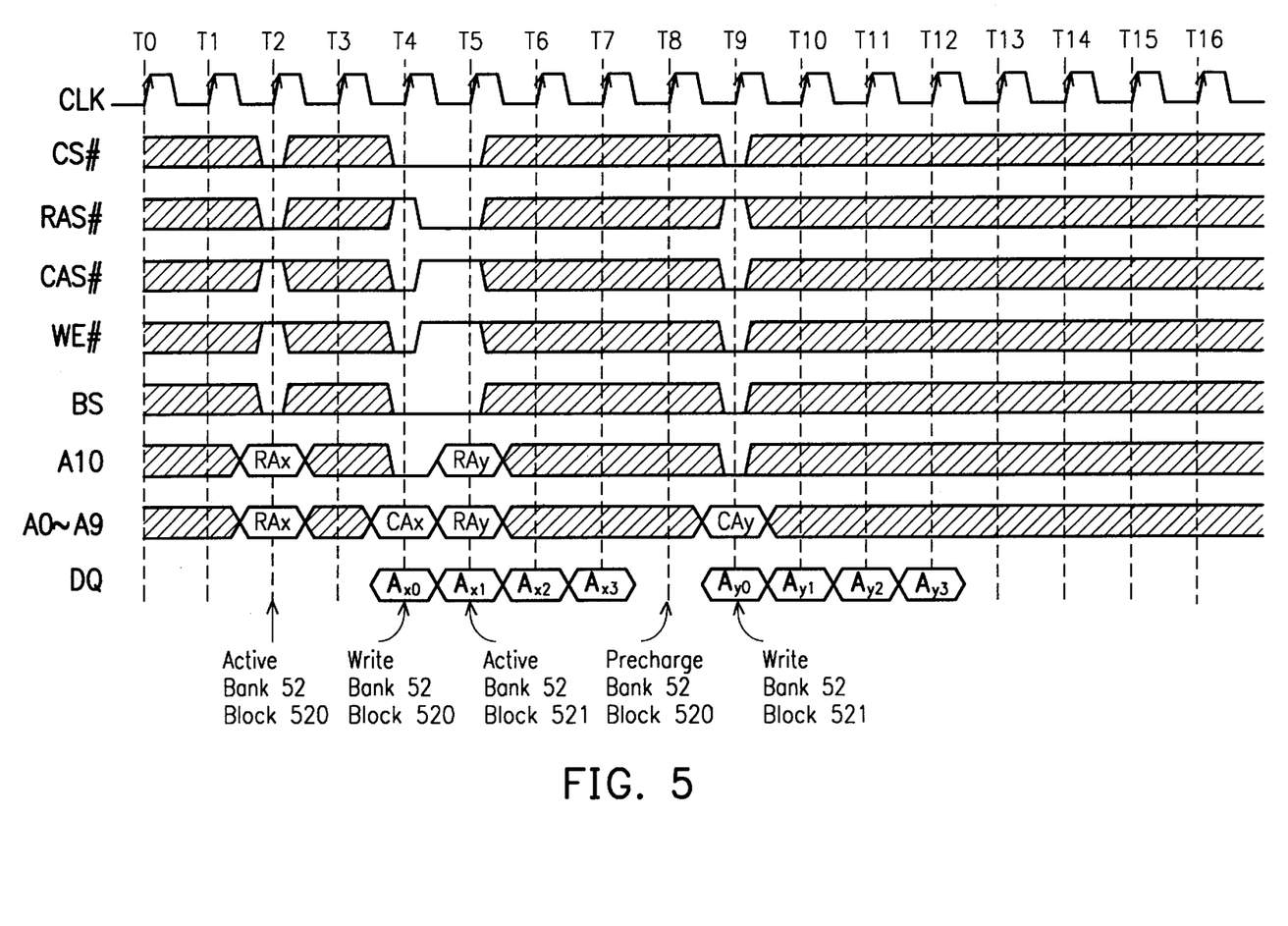
FIG. 5 shows a timing diagram of the related signals in a second example of the embodiment, which illustrates the case of writing data to different memory blocks in the same memory bank.

FIG. 5 shows a timing diagram of the related signals in a second example of the embodiment. This case illustrates a situation of writing data to different memory blocks in the same memory bank. At the outset, an activate command is issued to activate block 520 of bank 52 at the rising edge T2. Together with this activation instruction, row address RAx dedicated to block 520 is also presented at A0~A10. At the rising edge T4, a write command (when CS#, CAS# and WE# are low and RAS# are high) for block 520 of bank 52 is issued, together with column address CAx at A0~A9. Note that a burst of write data $A_{x0}$, $A_{x1}$, $A_{x2}$ and $A_{x3}$ is presented at the terminals DQ immediately. There is no latency between the write command and the presence of the data for writing. The precharge operation associated with this write command is initiated at rising edge T8. In addition, at the rising edge T5, an activate command is issued to activate block 521 of bank 52, together with row address RAy at A0~A10. Note that any access command for block 521 must be issued after the precharge operation of block 520. Therefore, a write command for block 521 of bank 52 is issued together with a column address CAy at rising edge T9. Similar to the previous write operation, data $A_{y0}$, $A_{y1}$, $A_{y2}$ and $A_{y3}$ prepared to be written must be presented at the terminals DQ when the write command is issued.

Figure 6:
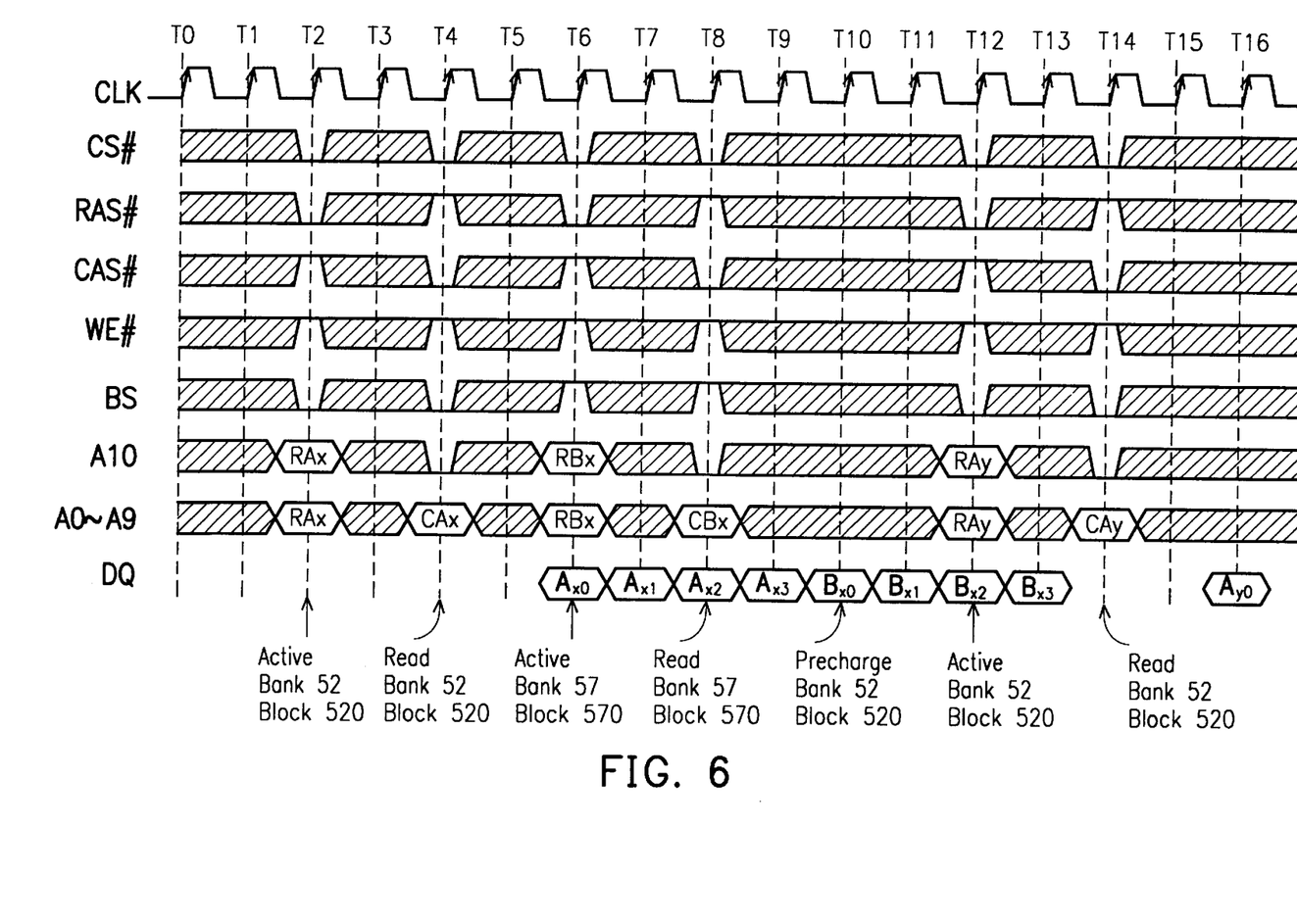
FIG. 6 shows a timing diagram of the related signals in a third example of the embodiment, which illustrates the case of reading data from correlated memory blocks in different memory banks.

FIG. 6 shows a timing diagram of the related signals in a third example of the embodiment. This case illustrates a situation of reading data from correlated memory blocks in different memory banks, for example, block 520 and block 570. At the rising edge T2, an activate command for block 520 of bank 52 is issued, together with row address RAx at A0~A10. At the rising edge T4, a read command for block 520 of bank 52 is issued, together with column address CAx. The corresponding data $A_{x0}$, $A_{x1}$, $A_{x2}$ and $A_{x3}$ for the read command are sequentially presented at the rising edges T6~T9. The precharge operation for block 520 of bank 52 is initiated at the rising edge T10. In addition, at the rising edge T6, an activate command for block 570 of bank 57 is issued, together with row address RBx at A0~A10. At the rising edge T8, a read command for block 570 of bank 57 is issued, together with column address CBx. The corresponding data $B_{x0}$, $B_{x1}$, $B_{x2}$ and $B_{x3}$ are sequentially presented at the rising edges T10~T13, immediately following the data $A_{x0}$, $A_{x1}$, $A_{x2}$ and $A_{x3}$. Another activate command at the rising edge T12 and read command at the rising edge T14 are similar to the preceding commands, except for row address RAy and column address CAy.

Figure 7:
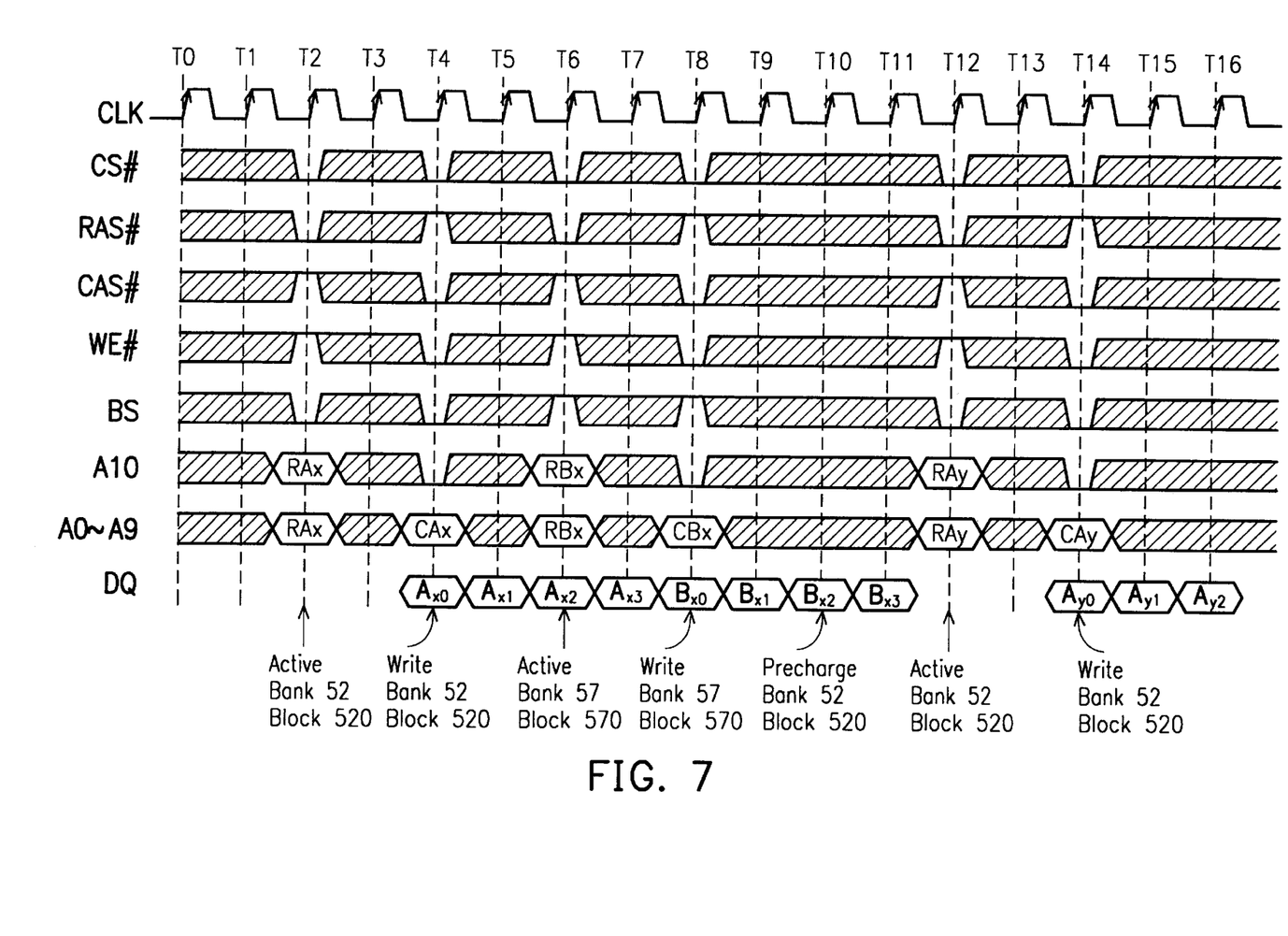
FIG. 7 shows a timing diagram of the related signals in a fourth example of the embodiment, which illustrates the case of writing data to correlated memory blocks in different memory banks.

FIG. 7 shows a timing diagram of the related signals in a fourth example of the embodiment. This case illustrates a situation of writing data to correlated memory blocks in different memory banks. At the rising edge T2, an activate command for block 520 of bank 52 is issued, together with row address RAx at A0~A10. At the rising edge T4, a read command for block 520 of bank 52 is issued, together with column address CAx. The corresponding data $A_{x0}, A_{x1}, A_{x2},$ and $A_{x3}$ for the write command are sequentially presented at the rising edges T4~T7. Note that there is no latency between the write command and the presence of the data for writing. The precharge operation for block 520 of bank 52 is initiated at the rising edge T10, for satisfying the timing requirement. In addition, at the rising edge T6, an activate command for block 570 of bank 57 is issued, together with row address RBx at A0~A10. At the rising edge T8, a write command for block 570 of bank 57 is issued, together with column address CBX. The corresponding data $B_{x0}, B_{x1}, B_{x2}$ and $B_{x3}$ for the write command are sequentially presented at the rising edges T8~T11, immediately following the data $A_{x0}, A_{x1}, A_{x2}$ and $A_{x3}$. Another activate command at the rising edge T12 and write command at the rising edge T14 are similar to the preceding commands, except for row address RAy and column address CAy.

Figure 8:
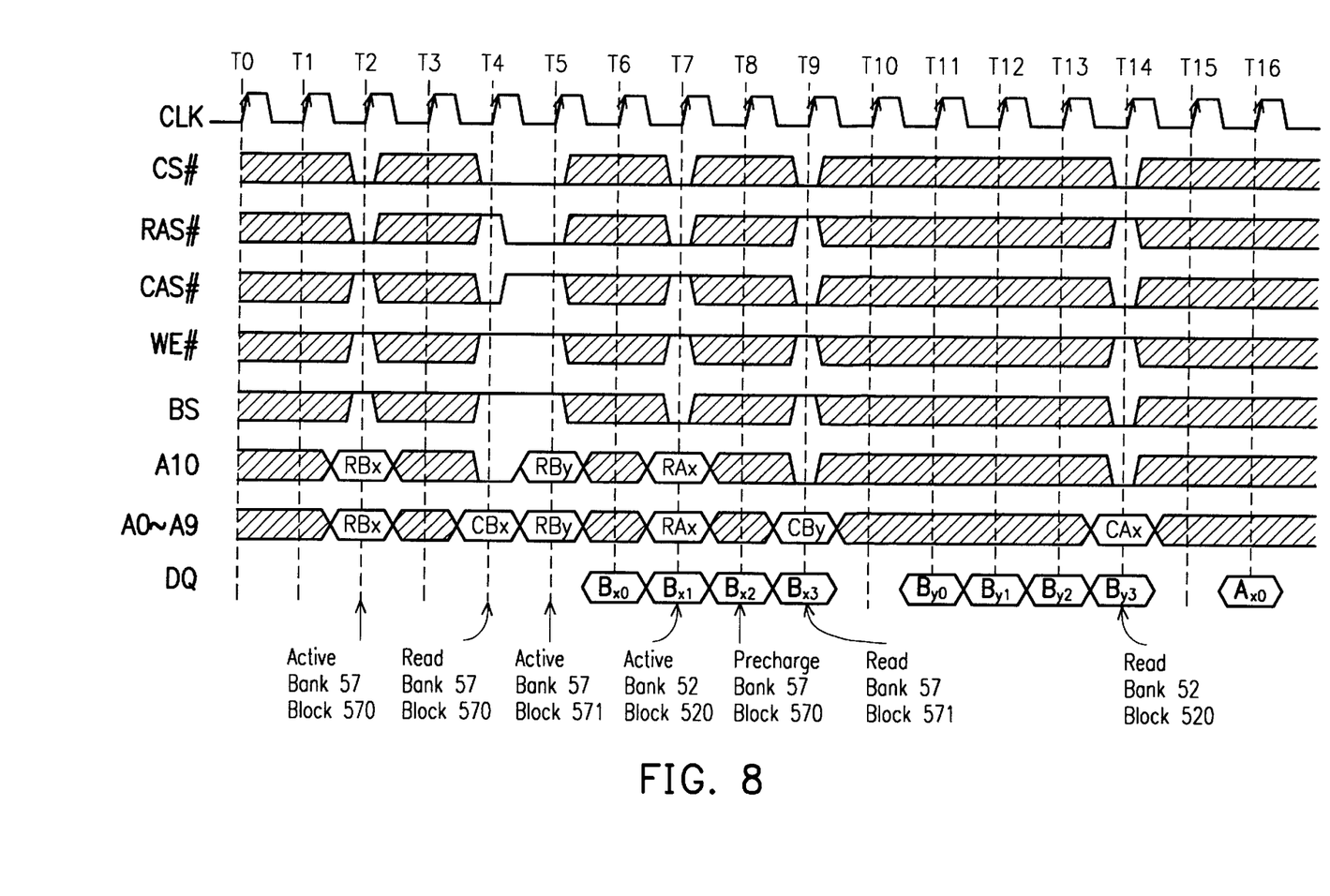
FIG. 8 shows a timing diagram of the related signals in a fifth example of the embodiment, which illustrates the case of reading data from interleaving memory banks.

FIG. 8 shows a timing diagram of the related signals in a fifth example of the embodiment. This case illustrates a situation of reading data from interleaving memory banks. The operations are described as follows. At the rising edge T2, an activate command for block 570 of bank 57 is issued, together with row address RBx at A0~A10. At the rising edge T4, a read command for block 570 of bank 57 is issued, together with column address CBx at A0~A9. The corresponding data $B_{x0}, B_{x1}, B_{x2}$ and $B_{x3}$ for this read command are sequentially presented at the rising edges T6~T9. The precharge operation for block 570 is initiated at the rising edge T8. In addition, at the rising edge T5, an activate command for block 571 of bank 57 is issued, together with row address RBy at A0~A10. At the rising edge T9 after the initiation of the precharge function, a read command for block 571 of bank 57 is issued, together with column address CBy at A0~A9. The corresponding data $B_{y0}, B_{y1}, B_{y2}$ and $B_{y3}$ for this read command are sequentially presented at the rising edges T11~T14. The precharge operation for block 571 is initiated at the rising edge T13. In addition, at the rising edges T7 and T14, an activate command and a read command for block 520 of bank 52 are respectively issued. They have similar operations as the preceding two access commands. This reveals that the precharge scheme in accordance with the present invention can be applied to access the interleaving banks.

Figure 9:
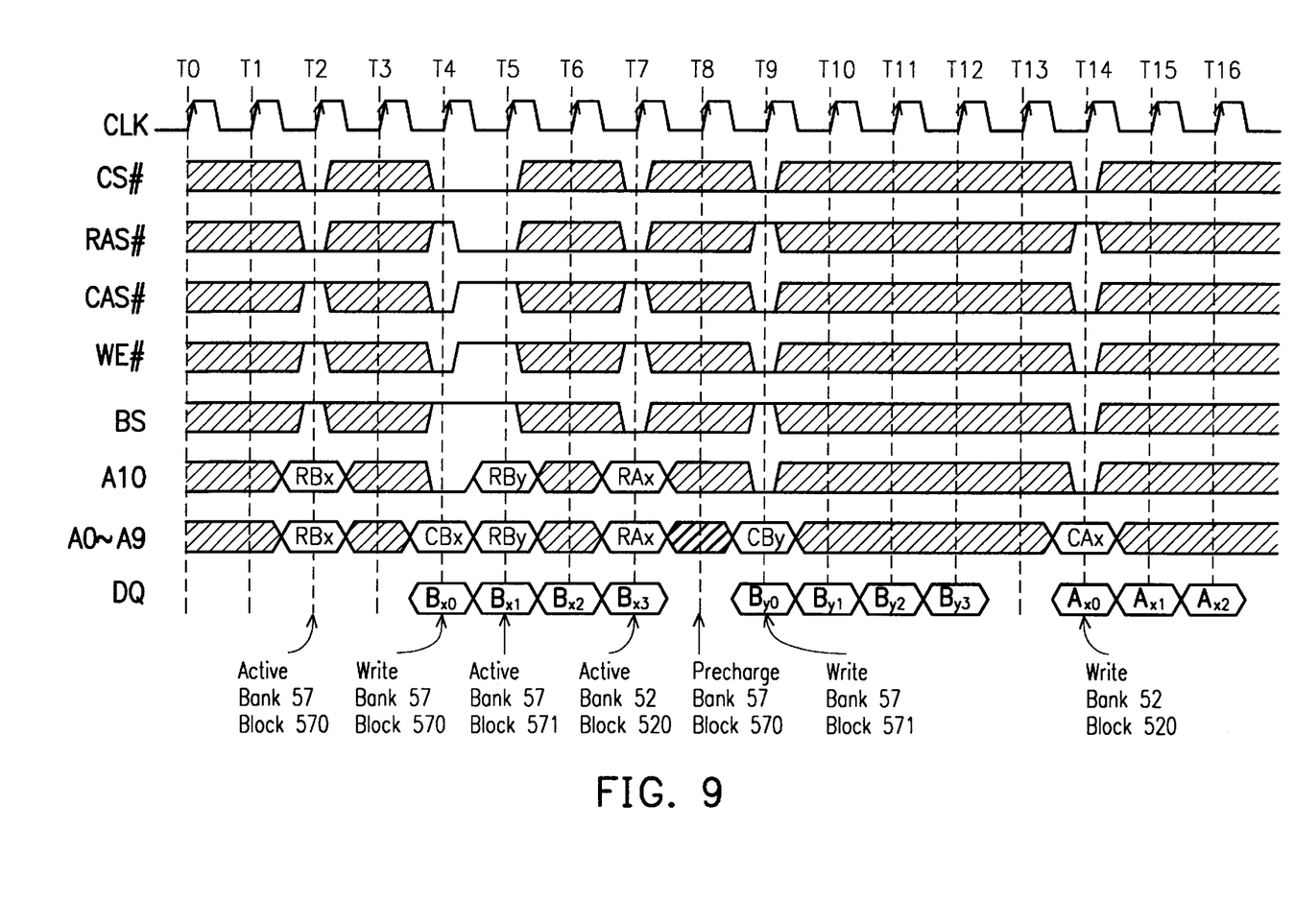
FIG. 9 shows a timing diagram of the related signals in a sixth example of the embodiment, which illustrates the case of writing data to interleaving memory banks.

FIG. 9 shows a timing diagram of the related signals in a sixth example of the embodiment. This case illustrates a situation of writing data to interleaving memory banks. FIG. 9 has similar timing characteristics to those of FIG. 8, except that there is no latency between a write command and the presence of the data for writing.

The foregoing description of preferred embodiments of the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method of segmentally precharging semiconductor memory device, said semiconductor memory device including memory banks for interleaving data access, said method comprising the steps of:

issuing a first access command to a first portion of one of said memory banks; and initiating a precharge operation to said first portion of said one memory bank when a second access command is issued to a second portion of said one memory bank, said first portion and said second portion having theirs own row access circuits, respectively.

2. The method according to claim 1, wherein in the step of initiating the precharge operation further includes a step of respectively generating two control signals for said first portion and said second portion, one of said control signals for said first portion being used to precharge said first portion and another of said control signals for said second portion being used to activate said second portion.

3. A method of segmentally precharging semiconductor memory device, said semiconductor memory device including memory banks for interleaving data access, said method comprising the steps of:

issuing a first access command to a first portion of one of said memory banks; and initiating a precharge operation to said first portion of said one memory bank when a second access command is issued to a second portion of another one of said memory banks.

4. The method according to claim 3, wherein in the step of initiating the precharge operation further includes a step of respectively generating two control signals for said first portion and said second portion, one of said control signals for said first portion being used to precharge said first portion and another of said control signals for said second portion being used to activate said second portion.

* * * * *